United States Patent [19]

Leisure et al.

[11] Patent Number: 5,070,037
[45] Date of Patent: Dec. 3, 1991

[54] INTEGRATED CIRCUIT INTERCONNECT HAVING DUAL DIELECTRIC INTERMEDIATE LAYER

[75] Inventors: Ronald K. Leisure, Kokomo; Oya F. Larsen, Amboy; Ronald K. Reger, Noblesville, all of Ind.

[73] Assignee: Delco Electronics Corporation, Kokomo, Ind.

[21] Appl. No.: 401,311

[22] Filed: Aug. 31, 1989

[51] Int. Cl.[5] ............................................ H01L 21/90
[52] U.S. Cl. .................................... 437/195; 437/189; 437/229; 437/235; 148/DIG. 43
[58] Field of Search ............... 148/DIG. 43; 437/189, 437/229, 235, 195

[56] References Cited

U.S. PATENT DOCUMENTS

| 4,199,384 | 4/1980 | Hsu | 148/DIG. 43 |
| 4,523,372 | 6/1985 | Balda et al. | 437/194 |
| 4,723,197 | 2/1988 | Takiar et al. | 361/403 |
| 4,825,278 | 4/1989 | Hillenius et al. | 357/53 |
| 4,906,592 | 3/1990 | Merenda et al. | 437/195 |

FOREIGN PATENT DOCUMENTS 59-032153 2/1984 Japan .
59-232424 12/1984 Japan .
63-099550 4/1988 Japan .

OTHER PUBLICATIONS

"Delco Electronics Production Process Specification for the Deposition of a Single Dielectric Layer".

Primary Examiner—Brian E. Hearn
Assistant Examiner—Laura M. Holtzman
Attorney, Agent, or Firm—Domenica N. S. Hartman

[57] ABSTRACT

This invention comprehends a multilevel electrically conductive interconnect for an integrated circuit wherein an inventive feature of the interconnect is the intermediate dual dielectric layer between the non-contacting portions of the surrounding metal conductors. The dual dielectric layer consists of a first dielectric layer and a second dielectric layer preferably formed from a polyimide material. The dual dielectric layer provides a significant improvement in defect density and a substantially planarized surface for the deposition of the top conductor, thereby improving the reliability and integrity of the electrical interconnection and integrated circuit.

5 Claims, 1 Drawing Sheet

INTEGRATED CIRCUIT INTERCONNECT HAVING DUAL DIELECTRIC INTERMEDIATE LAYER

This invention relates to multilevel conductive interconnects for integrated circuits and techniques for forming these multilevel conductive interconnects. In particular, this invention relates to multilevel conductive interconnects which comprise a dual dielectric intermediate layer between the different levels of conductive interconnect.

BACKGROUND OF THE INVENTION

Technology is continually seeking to miniaturize the individual components within an integrated circuit while concurrently increasing the complexity of the circuitry. Because of these seemingly contrary demands, the art has had to develop innovative methods for positioning and electrically interconnecting the various components which are located on an integrated circuit. One well known solution developed by the art includes forming multilevel interconnections wherein two or more conductors which are on different levels of the integrated circuit are electrically interconnected by means of a via, or through-hole, which has been filled or plated with electrically conductive material. The conductors are separated everywhere else by an intermediate dielectric layer.

Currently, these multilevel conductive interconnects are formed using only a single layer of plasma enhanced deposited silicon nitride as the intermediate dielectric material. This current method is adequate, however there are shortcomings associated with it.

Firstly, the dielectric layer is deposited onto a first conductive strip, which is typically not planar but rather has discrete sides and a top surface. Therefore, the dielectric layer takes on the shape of this underlying first conductive strip, curving around and over the corners of the underlying conductive strip. Thus when the second overlaying conductor is deposited onto the dielectric, the second conductor must also conform to any curves, corners or steps in the dielectric layer. Typically, the second conductor adheres poorly around these corners or steps. This results in high electrical resistance in the conductor at these points, a feature highly undesirable for an electrical conductor.

Another shortcoming associated with this conventional method arises because there is only a single intermediate dielectric layer between the first and second metal conductors. If the dielectric layer has any defects, the defects may result in electrical shorting between the first and second metal conductors. Again, this is highly undesirable in an integrated circuit.

Therefore, it is desirable to provide an electrical interconnection means which alleviates these current shortcomings by providing (1) a planarized surface for deposition of the second metal conductor so as to eliminate the problem of poor step coverage and associated high electrical resistance, and (2) a dual dielectric intermediate layer between the surrounding first and second metal conductors so as to result in noncoincident alignment of defects and alleviate the problem of electrical shorting between the conductors.

SUMMARY OF THE INVENTION

It is an object of the present invention to provide means for electrical interconnection on an integrated circuit.

It is a further object of this invention that such means be provided by a dual dielectric intermediate layer between the surrounding conductive layers.

Lastly, it is a still further object that such dual dielectric intermediate layer provide a substantially planar surface for deposition of the overlying, or top, conductive layer.

In accordance with a preferred embodiment of this invention, these and other objects and advantages are accomplished as follows.

This invention comprehends a multilevel electrically conductive interconnect for an integrated circuit wherein an inventive feature of the interconnect is the intermediate dual dielectric layer between the surrounding metal conductors.

The interconnect comprises a first metal conductor formed on an appropriate substrate, a dual dielectric intermediate layer, and a second metal conductor formed upon the dual dielectric layer which contacts an exposed region of the first metal conductor through a via hole. The intermediate dual dielectric layer comprises a first dielectric layer, preferably plasma deposited silicon oxide or nitride, and an overlaying second dielectric layer, preferably a polyimide.

The dual dielectric layer provides a substantially planar surface for the deposition of the top, or overlaying, second metal conductor. This alleviates the typical shortcomings associated with poor step coverage of the second metal conductor. Further, the dual dielectric layer provides two intermediate layers having noncoincident defects, therefore significantly decreasing the overall defect density of the intermediate dielectric layer resulting in a substantially decreased probability of electrical shorting between the surrounding metal conductors.

Other objects and advantages of this invention will be better appreciated from a detailed description thereof, which follows.

BRIEF DESCRIPTION OF THE DRAWINGS

The above and other advantages of this invention will become more apparent from the following description taken in conjunction with the accompanying drawings wherein like references refer to like parts and wherein.

DETAILED DESCRIPTION OF THE INVENTION

This invention comprehends a multilevel electrically conductive interconnect for an integrated circuit wherein an inventive feature of the interconnect is the intermediate dual dielectric layer between the surrounding metal conductors.

Figure 1:
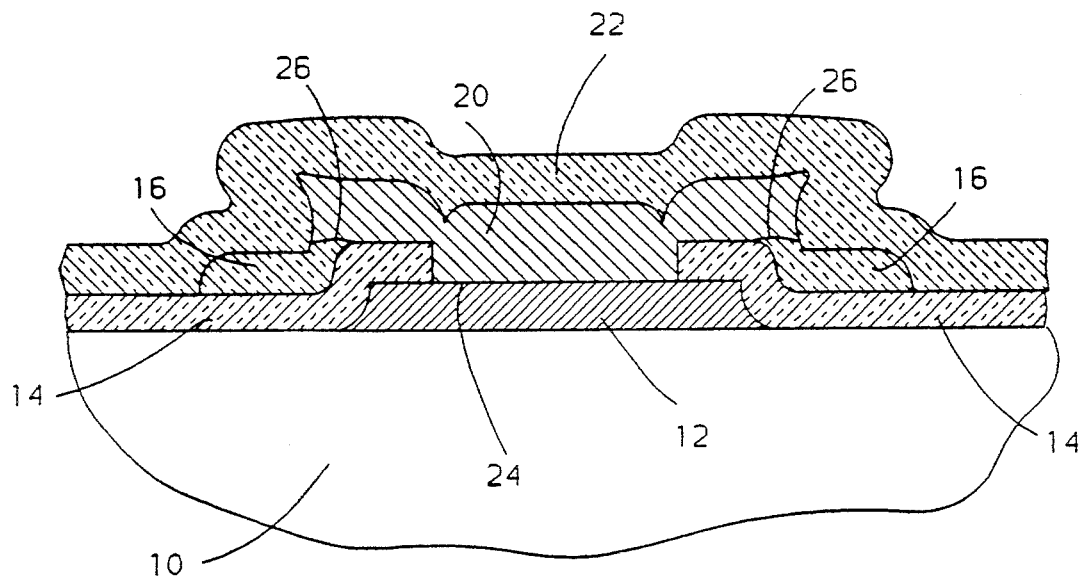
FIG. 1 is a cross sectional view of a multilevel electrically conductive interconnect having an intermediate dual dielectric layer in accordance with a preferred embodiment of this invention.

As shown in FIG. 1, this inventive interconnect is used in an integrated circuit which has been formed on an appropriate substrate 10, preferably single crystal silicon. A first metal conductor 12 is contacted by means of a via or through-hole at its surface 24 by a second metal conductor 20, which has been formed on a separate level of the integrated circuit. The first and second conductors, 12 and 20 respectively, are separated everywhere except at their contacted surface 24 by an intermediate dual dielectric layer 18. As enlarged in FIG. 2, the dual dielectric layer 18 consists of a first dielectric layer 14, preferably formed from silicon oxide or silicon nitride, and a second dielectric layer 16, preferably formed from a polyimide. The combination of the polyimide layer 16 in the dual dielectric layer 18 decreases the overall pinhole defect density of the intermediate layer, thereby significantly reducing the probability for electrical shorting between the surrounding metal conductors 12 and 20, and improving the reliability of the integrated circuit. In addition, the dual dielectric layer 18 provides a substantially planar surface 26 upon which the second conductive layer 20 is deposited, thereby alleviating the previous problem of high electrical resistance due to the poor step coverage over the conventional single dielectric layer. A third dielectric layer 22, preferably silicon oxide or silicon nitride, is then preferably blanket deposited over the entire multilevel interconnect to primarily seal the polyimide layer 16 from possible water absorption or other damage.

A first metal conductor 12 is formed on the substrate 10. The first metal conductor 12 may be formed from any conventional conductive materials, although preferred is a metal compound containing approximately 98% aluminum, 1% silicon and 1% copper, and by any conventional deposition or printing techniques. It is preferred for practicality purposes that the first metal conductor 12 have a thickness of approximately 1.5 to 1.8 microns, although this may vary depending on the intended application of the integrated circuit and size of the other components.

After formation of the first metal conductor 12, a first layer of dielectric material 14 is deposited and patterned on the first metal conductor 12. The first dielectric layer 14 is preferably formed by conventional plasma assisted chemical vapor deposition of silicon oxide or silicon nitride depending on the particular application. Silicon oxide appears to be the most preferred in some applications because of its electrical characteristics, however the silicon nitride is preferred in other applications which do not require the electrical characteristics because it is characterized by better physical properties. The preferred thickness of this first dielectric layer 14 is approximately 1.1 microns, with a preferred range between about 0.8 to about 1.2 microns. Again, this is for practicality purposes only, since the thickness may vary considerably without detrimental effects. The first dielectric layer 14 is conventionally patterned so as to expose a top surface 24 of the first conductor 12. This surface 24 is where the subsequently formed second conductor layer 20 will contact the first conductive layer 12 to form a multilevel interconnect.

As shown in FIG. 1, the first dielectric layer 14 conforms to the shape of the first conductor 12, therefore the first dielectric layer 14 is inherently curved or stepped where it conforms to the edges of the first conductor 12. Using previous conventional techniques, this would have presented a serious shortcoming since the subsequently formed second metal conductor layer 20 would be deposited onto that curved dielectric surface. Typically, the metal coverage of the second conductor 20 at these steps would be extremely poor and result in increased electrical resistance of the conductor.

Figure 2:
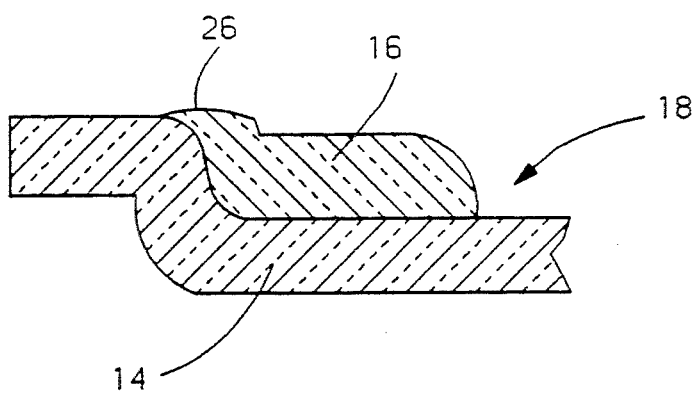
FIG. 2 is an enlarged view of the preferred intermediate dual dielectric layer as shown in FIG. 1.

However, with our method, a second dielectric layer 16 is formed on the first dielectric layer 14 to form a dual dielectric structure 18, as shown enlarged in FIG. 2. The second dielectric layer 16 is preferably formed from a polyimide material, such as commercially available 2703-D from DuPont Company. This preferred polyimide is photosensitive therefore it responds similarly to photoresist when exposed to light, therefore patterning of the polyimide does not require any additional photoresist deposition steps. The preferred polyimide layer 16 forms a substantially planar surface 26 in that region where the subsequently formed second conductive layer 20 will be deposited. This results in improved deposition and coverage of the second conductive layer 20, and alleviates the shortcomings associated with the previous methods. In addition, the polyimide layer 16 decreases the overall pinhole or other defect density of the dielectric layer, thereby significantly increasing the reliability of the electrical system.

The second dielectric layer 16, or polyimide layer, is formed using the following preferred steps. Preferably, the surface to which the polyimide will be deposited, here the top surface of the first dielectric layer 14, is cleaned first by means of exposure to an oxygen plasma for approximately 15 minutes. The polyimide is then spun onto the wafer using conventional means. The wafers are then soft-baked, to drive off any solvents by means of a 60 second, 90° C. hot plate, which is followed by 45 minute, 55° C. convection bake. The wafers are then photolithographically patterned so as to be disposed upon the stepped regions of the first dielectric layer 14 to provide a substantially planarized surface 26 in that region. This is accomplished by exposing the wafers to polymerize the polyimide using a nominal 9-11 mw/cm$^2$ intensity lamp. The wafers are then developed to remove the unpolymerized regions of the polyimide by rinsing in a solution consisting of 1:1 4-Butyrolactone:Xylene for approximately 25 seconds. The duration between the initial cleaning to development steps should not exceed about four hours for optimum results. During the development steps, the exposed polyimide thickness loss is approximately 28 percent.

The photolithography of the polyimide is followed by a polyimide cure preferably at a first temperature of about 300° C. for twenty minutes, followed by about 20 minutes at approximately 440° C., wherein the thickness of the polyimide layer 16 shrinks approximately another 45 percent.

After curing, a descumming step is preferred to remove the polyimide residue which has backdeposited in the vias. This consists of a short oxygen stripping step, which should not remove more than about 1500 Angstroms from the top surface of the polyimide layer 16. The final preferred thickness for the dry polyimide layer 16 is approximately 1.6 to 1.8 microns, preferably 1.7 microns for practicality purposes. Preferably prior to deposition of the second conductor layer 20, the wafers will be convection baked at approximately 200° C. for about 30 minutes to dry out the polyimide so as to prepare its surface for good metal adhesion during deposition of the second conductive layer 20.

The second conductive layer 20 is then formed by preferably sputtering an appropriate metal, such as the metal containing approximately 98% aluminum, 1% silicon, and 1% copper used to form the first metal conductor, everywhere on the surface. A preferred sputtering cycle consists of a first RF etch to clean the surface, followed by a 350° C. preheat cycle, which is subsequently followed by the actual deposition at about 300° C. The sputtering equipment which has been used is a Varian 3190 type machine. An appropriate photoresist is then used to pattern the second conductive layer 20. The photoresist is then stripped by a wet chemical which is specifically selected for preserving the polyimide layer 16 integrity and preventing any damage to the various other materials. The preferred wet chemical etch is commercially available KTI DC-3 Stripper from KTI Chemical, which is characterized by comprising 1-methyl-2-pyrrolidinone, 2-"2-butoxyethoxy" ethanol and monoethanolamine. The preferred final thickness of this second conductive layer 20 preferably ranges between about 2.2 to about 2.9 microns.

After this wet photoresist stripping step, another descumming step is highly preferred to ensure the dielectric quality of the top surface of the polyimide layer 16. The descumming step is similar to the previous descumming step.

Lastly, it is preferred that a passivation layer 22, preferably silicon nitride, be blanket deposited over the components, particularly to passivate the various materials and seal the exposed polyimide layer 16 so as to prevent any possible water absorption by the polyimide layer 16 or other detrimental effects. The preferred thickness of this passivation layer 22 is approximately 1.3 to about 1.7 microns considering the thicknesses of the other layers.

With this invention, an integrated circuit, multilevel conductive interconnect is provided and characterized by an intermediate dual dielectric layer 18. The dual dielectric layer 18 provides a substantially planarized surface 26 for the deposition of the top conductor 20 thereby ensuring good coverage and electrical integrity, while also significantly decreasing the overall defect density of the intermediate dual dielectric layer 18 so as to substantially decrease the probability of electrical shorting between the surrounding metal conductors 12 and 20.

This invention readily facilitates the modification of the design or materials of the various components or the number of conductive layers. Therefore, while our invention has been described in terms of preferred embodiments, it is apparent that other forms could be adopted by one skilled in the art, such as by substituting other dielectric or conductive materials, or by varying the processing parameters. Accordingly the scope of our invention is to be limited only by the following claims.

The embodiments of the invention in which an exclusive property or privilege is claimed are defined as follows:

1. A method for forming an integrated circuit having a multilevel conductive interconnection comprising the following steps:
    providing an appropriate semiconductive integrated circuit substrate;
    forming a first metal pattern on said substrate;
    forming a blanket first dielectric layer of a first dielectric material on said first metal pattern so that said first dielectric material layer completely covers said first metal pattern;
    patterning said first dielectric layer to form an opening that exposes a selected surface portion of said first metal pattern;
    forming a blanket second dielectric layer of a second dielectric material on said first patterned dielectric layer so as to form a dual layer dielectric coating consisting of said first dielectric layer and said second dielectric layer, said second dielectric material being an organic material resistant to degradation at elevated temperatures; and
    patterning said second dielectric layer to form an opening in the second dielectric layer that wholly surrounds said opening in said first dielectric layer, effective to expose a surface of said first dielectric layer contiguous said exposed part of said selected portion of said first metal pattern,
    forming a second metal pattern upon said dual layer dielectric coating, said second metal pattern having a portion covering said opening in said second dielectric layer, so that said second metal pattern contacts said first metal pattern at said exposed part of said first metal pattern;
    effective to form a multilevel conductive interconnect having said dual dielectric coating intermediate said different levels of metal conductor everywhere except at said exposed part of said first metal pattern, where said metal patterns contact each other.

2. A method for forming an integrated circuit having a multilevel conductive interconnection as recited in claim 1 further comprising a final step wherein a third layer of dielectric material is blanket deposited over the structure formed by the method of claim 1 so as to substantially envelope said second dielectric layer with said third dielectric material and cover any exposed parts of said second dielectric layer.

3. A method for forming an integrated circuit having a multilevel conductive interconnection comprising the following steps:
    providing a silicon integrated circuit substrate;
    forming a first metal pattern on said substrate;
    forming a blanket first dielectric layer of a first dielectric material chosen from the group consisting of silicon oxide or silicon nitride on said first metal pattern so that said first dielectric layer completely envelops said first metal pattern;
    patterning said first dielectric layer to form an opening that exposes a selected surface portion of said first metal pattern;
    forming a second dielectric layer of a photosensitive polyimide dielectric material on said first patterned dielectric layer so as to form a dual layer dielectric coating consisting of said first dielectric material and said polyimide, said dual dielectric coating having a substantially planarized surface;
    patterning said second dielectric layer to from an opening in the second dielectric layer that wholly surrounds the opening in said first dielectric layer, effective to expose a surface of said first dielectric layer surrounding said opening therein and form an exposed ring of said first dielectric layer surrounding said exposed part of said selected portion of said first metal pattern;
    forming a second metal pattern upon said substantially planarized surface of said dual layer dielectric coating, said second metal pattern having a portion covering said opening in said second dielectric layer, so that said second metal pattern contacts said first metal pattern at said exposed part of said first metal pattern; and
    depositing a third blanket layer of protective dielectric material upon said second metal conductor and any exposed regions of said second dielectric material;

effective to form a multilevel conductive interconnect having said dual dielectric layer intermediate between said different levels of metal conductor everywhere except at said exposed part of said first metal pattern, where said metal patterns contact each other.

4. The method as defined by claim 3 in which the first layer dielectric is silicon oxide and the silicon oxide layer is formed by plasma assisted chemical vapor deposition.

5. The method as defined in claim 3 in which the coated substrate is exposed to an oxygen plasma both before and after the second metal pattern is formed, respectively to clean said exposed part of said first metal pattern to make a low resistance electrical connection with said second metal and to ensure dielectric quality of said polyimide at its surface not covered by the second metal pattern.

* * * * *